US011480734B2

(12) United States Patent
Park et al.

(10) Patent No.: US 11,480,734 B2
(45) Date of Patent: Oct. 25, 2022

(54) ACTIVE-PASSIVE PHOTONIC INTEGRATED CIRCUIT PLATFORM

(71) Applicants: Hyundai Park, Goleta, CA (US); Tin Komljenovic, Santa Barbara, CA (US); Chong Zhang, Goleta, CA (US); Minh Tran, Goleta, CA (US)

(72) Inventors: Hyundai Park, Goleta, CA (US); Tin Komljenovic, Santa Barbara, CA (US); Chong Zhang, Goleta, CA (US); Minh Tran, Goleta, CA (US)

(73) Assignee: Nexus Photonics, Inc, Goleta, CA (US)

( * ) Notice: Subject to any disclaimer, the term of this patent is extended or adjusted under 35 U.S.C. 154(b) by 209 days.

(21) Appl. No.: 16/600,349

(22) Filed: Oct. 11, 2019

(65) Prior Publication Data

US 2021/0088727 A1  Mar. 25, 2021

Related U.S. Application Data

(60) Provisional application No. 62/906,058, filed on Sep. 25, 2019.

(51) Int. Cl.
*G02B 6/12* (2006.01)
*G02B 6/26* (2006.01)
(Continued)

(52) U.S. Cl.
CPC ............ *G02B 6/14* (2013.01); *G02B 6/12004* (2013.01); *G02B 6/1228* (2013.01); *G02B 6/13* (2013.01); *G02B 2006/12152* (2013.01)

(58) Field of Classification Search
CPC .......... G02B 6/14; G02B 6/1228; G02B 6/13; G02B 6/12004; G02B 2006/12152;
(Continued)

(56) References Cited

U.S. PATENT DOCUMENTS 6,282,345 B1 * 8/2001 Schimpe .................. G02B 6/42
385/50
2008/0226224 A1 * 9/2008 Blauvelt .............. G02B 6/2852
385/14
(Continued)

*Primary Examiner* — Kaveh C Kianni
*Assistant Examiner* — Hung Q Lam
(74) *Attorney, Agent, or Firm* — Shalini Venkatesh

(57) ABSTRACT

A device providing efficient transformation between an initial optical mode and a second optical mode includes first, second and third elements fabricated on a common substrate. The first element includes first and second active sub-layers supporting initial and final optical modes with efficient mode transformation therebetween. The second element includes a passive waveguide structure supporting a second optical mode. The third element, at least partly butt-coupled to the first element, includes an intermediate waveguide structure supporting an intermediate optical mode. If the final optical mode differs from the second optical mode by more than a predetermined amount, a tapered waveguide structure in the second or third elements facilitates efficient transformation between the intermediate optical mode and the second optical mode. Precise alignment of sub-elements formed in one of the elements, relative to sub-elements formed in another one of the elements, is defined using lithographic alignment marks.

9 Claims, 8 Drawing Sheets

(51) Int. Cl.
*G02B 6/42* (2006.01)
*G02B 6/14* (2006.01)
*G02B 6/122* (2006.01)
*G02B 6/13* (2006.01)

(58) Field of Classification Search
CPC .......... G02B 2006/12173; G02B 2006/12121; G02B 6/305; G02B 6/1223; G02B 6/4224
USPC .................................. 385/14–15, 28, 30, 43
See application file for complete search history.

(56) References Cited

U.S. PATENT DOCUMENTS

2014/0294341 A1\* 10/2014 Hatori .................. G02B 6/1228
 385/14
2018/0100970 A1\* 4/2018 Park ..................... G02B 6/1228

\* cited by examiner

ACTIVE-PASSIVE PHOTONIC INTEGRATED CIRCUIT PLATFORM

CROSS-REFERENCES TO RELATED APPLICATIONS

This application claims priority from U.S. Provisional Patent Application Ser. No. 62/906,058, entitled "Active-Passive Photonic Integrated Circuit Platform", filed on 25 Sep. 2019, which is hereby incorporated by reference as if set forth in full in this application for all purposes.

This application is related to co-pending U.S. application Ser. No. 16/254,883, filed 23 Jan. 2019, which is incorporated by reference as if set forth in full in this application for all purposes.

FIELD OF THE INVENTION

The present invention relates to semiconductor processing. More specifically, certain embodiments of the invention relate to a method and system for realization of photonic integrated circuits using dissimilar materials that are optically coupled.

BACKGROUND OF THE INVENTION

A photonic integrated circuit (PIC) or integrated optical circuit is a device that integrates multiple photonic functions and as such is analogous to an electronic integrated circuit. The major difference between the two is that a photonic integrated circuit provides functions for information signals imposed on optical carrier waves. The material platform most commonly utilized for photonic integrated circuits is indium phosphide (InP), which allows for the integration of various optically active and passive functions on the same chip. Although many current PICs are realized in InP platforms, there has been significant research in the past decade in using silicon rather than InP for the realization of PICs, due to some superior characteristics as well as superior processing capabilities for the former material, that leverage the investment already made for electronic integrated circuits.

The biggest drawback in using silicon for PICs is that it is an indirect bandgap material which makes it hard to provide electrically pumped light sources. This problem is generally solved by assembling PICs comprising two or more chips made from dissimilar materials in separate processes. Such an approach is challenging due to a need for very fine alignment, which increases packaging costs and introduces scaling limitations. Another approach to solve the bandgap problem is to bond two dissimilar materials and process them together, removing the need for precise alignment and allowing for mass fabrication. In this disclosure, we use the term "hybrid" to describe the first approach that includes precise assembly of separately processed parts, and we use the term "heterogeneous" to describe the latter approach of bonding two materials and then processing the bonded result, with no precise alignment necessary.

To transfer the optical signal between dissimilar materials, the heterogeneous approach utilizes tapers whose dimensions are gradually changed until the effective mode refractive indices in dissimilar materials match and there is efficient power transfer. This approach generally works well when materials have similar refractive indices as is the case with silicon and InP. Although InP and silicon-based PICs address many current needs, they have some limitations; among them are the fact that the operating wavelength range is limited by material absorption increasing the losses, and the fact that there is a limit on the maximum optical intensities and consequently optical powers that a PIC can handle. To address these limitations, alternate waveguide materials have been considered, such as SiN, $TiO_2$, $Ta_2O_5$, AlN, $LiNbO_3$, various polymers or others. In general, such waveguides have higher bandgap energies which provides better high-power handling and transparency at shorter wavelength, but, in general such materials also have lower refractive indices from visible to IR range e.g. SiN with bandgap of ~5 eV has refractive index of ~2, AlN has bandgap of ~6 eV and refractive index of around ~2, and $SiO_2$ with bandgap of ~8.9 eV has refractive index of ~1.44. For comparison, the refractive index of GaAs and InP is >3. In cases where there is larger difference in effective indices, such as between e.g. SiN and InP, GaAs or GaN, the requirements on taper tip dimensions become prohibitive limiting efficient power transfer. Specifically, extremely small taper tip widths (of the order of nanometers) may be necessary to provide good coupling. Achieving such dimensions is complex and may be cost prohibitive.

The alternative hybrid approach suffers from the drawbacks already mentioned above, namely the need for precise alignment, and correspondingly complex packaging and scaling limitations.

The above noted patent application Ser. No. 16/254,883 describes a method that provides efficient optical coupling between materials with dissimilar refractive indices (such as high-refractive index materials mentioned above, used for active devices, and low-refractive index materials used for waveguides), without requiring prohibitively narrow taper tips. This allows for scalable integration of materials for the realization of PICs to comprise active gain medium that can be used to realize laser and/or detectors and passive, high-performing waveguides.

Many applications require efficient phase modulators, e.g. to imprint data onto optical carrier or to control the phase of signals on the PIC. In this disclosure we will use term phase modulator, but it is to be understood that it includes any type of structure that can predominantly control the phase of an optical signal, and the functionality does not have to be limited just to modulating the signal. Compared to simple thermal tuners, semiconductor-based phase modulators can provide superior performance such as much higher bandwidth (up to 100 GHz or more), low power consumption (typically μW or less) and practically no crosstalk even in dense configurations.

With proper bandgap design, such semiconductor phase modulators can be modified to provide efficient amplitude modulation with reduced insertion loss as is known in the art of designing efficient electro-absorption modulators.

Furthermore, semiconductor-based waveguides can provide high nonlinearity that can be useful to generate harmonics, combs or other non-linear effects. With proper bandgap design, their absorption losses can be controlled, and non-linear effects optimized by using high refractive index contrast waveguides where core is the semiconductor material, while cladding is provided by low refractive index materials described above.

There remains however, a need to develop and demonstrate a platform allowing for efficient, wafer-scale integration of high-performing amplitude and/or phase modulators with active gain medium to realize lasers and/or detectors that can be combined with highly non-linear semiconductor waveguides, all of which can be efficiently coupled to high-performance lower refractive index passive waveguides. Means to conveniently manipulate optical mode characteristics (such as phase) using active functionality within PICs would also be desirable.

SUMMARY OF THE INVENTION

The present invention includes devices and methods for providing practical and efficient optical coupling between elements comprising materials of different refractive indices, with particular relevance to integrated PICs.

In one embodiment, a device providing efficient transformation between an initial optical mode and a second optical mode comprises first, second and third elements fabricated on a common substrate. The first element comprises first and second active sub-layers supporting initial and final optical modes respectively with efficient mode transformation between said initial and final optical modes; the second element comprises a passive waveguide structure supporting a second optical mode; and the third element, at least partly butt-coupled to the first element to allow efficient capture of the final mode, comprises an intermediate waveguide structure supporting an intermediate optical mode. In this embodiment, if the final optical mode supported by the first element differs from the second optical mode by more than a predetermined amount, a tapered waveguide structure in at least one of the second and third elements facilitates efficient transformation between the intermediate optical mode and the second optical mode. Also, in this embodiment, wherein precise alignment of one or more sub-elements formed in one of the first, second and third elements, relative to one or more sub-elements formed in another one of the first, second and third elements, is defined using lithographic alignment marks.

In another embodiment, a device providing efficient transformation between a first optical mode and a second optical mode comprises: first, second and third elements fabricated on a common substrate. The first element comprises first and second active sub-layers collectively supporting the first optical mode, wherein at least one of the first and second active sub-layers is thinner than 250 nm; the second element comprises a passive waveguide structure supporting a second optical mode; and the third element, at least partly butt-coupled to the first element to allow efficient capture of the first optical mode, comprises an intermediate waveguide structure supporting an intermediate optical mode. In this embodiment, if the first optical mode differs from the second optical mode by more than a predetermined amount, a tapered waveguide structure in at least one of the second and third elements facilitates efficient transformation between the intermediate optical mode and the second optical mode. Also in this embodiment, precise alignment of one or more sub-elements formed in one of the first, second and third elements, relative to one or more sub-elements formed in another one of the first, second and third elements, is defined using lithographic alignment marks.

In yet another embodiment, a method for making a device comprises: forming a first element, comprising a dielectric material, on a substrate; defining a first waveguide, configured to support a first optical mode, in the first element; attaching a second element comprising first and second active sub-layers to the substrate, wherein the second active sub-layer, underlying the first active sub-layer, is thinner than 250 nm. The method further comprises defining, at a position relative to the first waveguide defined by lithographic alignment marks, a second waveguide configured to support a second optical mode in a first part of the second element, underlying the first active sub-layer; defining in the second sub-layer a third waveguide configured to support a third optical mode in a second part of the second element that does not underlie the first active sub-layer; forming, on the substrate, a third element between and in contact with the first and second elements, the position of the third element relative to the first and second elements being defined by lithographic alignment marks; and defining an intermediate waveguide in the third element. In this embodiment, a taper defined in at least one of the intermediate waveguide and the first waveguide facilitates transformation between the first and second optical modes if the first optical mode differs from the second optical mode by more than a predetermined amount.

In another embodiment, a method for making a device comprises: forming a first element, comprising a dielectric material, on a substrate; defining a first waveguide, configured to support a first optical mode, in the first element; attaching a second element comprising first and second active sub-layers to the substrate; and defining second and third waveguides configured to support initial and final optical modes respectively in the first and second active sub-layers respectively at a position relative to the first waveguide defined by lithographic alignment marks. The method further comprises forming, on the substrate, a third element between and in contact with the first and second elements, the position of the third element relative to the first and second elements being defined by lithographic alignment marks; and defining an intermediate waveguide supporting an intermediate mode in the third element. In this embodiment, a taper defined in at least one of the intermediate waveguide and the first waveguide facilitates transformation between the final and first optical modes if the final optical mode differs from the first optical mode by more than a predetermined amount.

DETAILED DESCRIPTION

Figure 1:
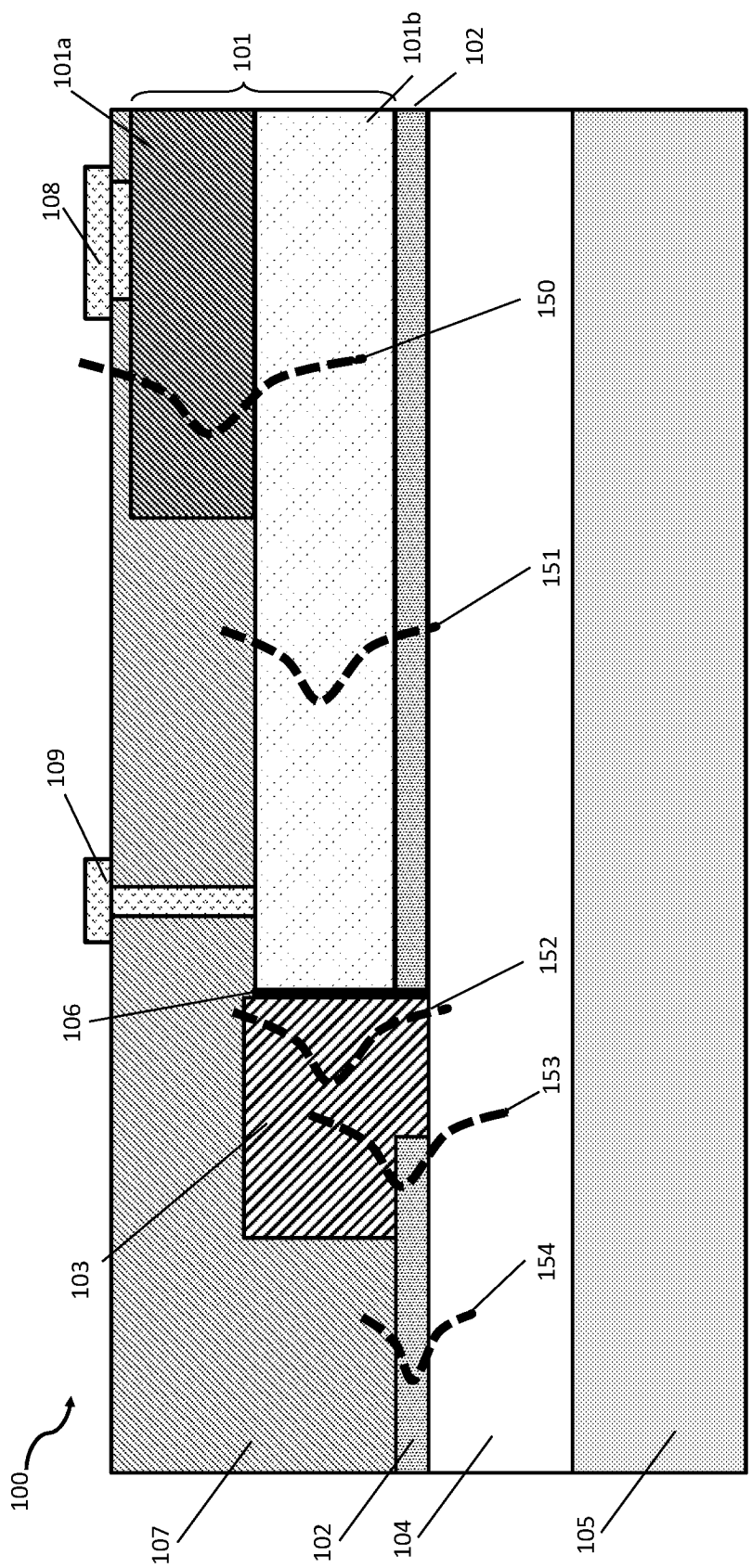
FIG. 1 illustrates a device according to one embodiment of the present invention, shown in cross-section.

Described herein are embodiments of a method and system for realization of photonic integrated circuits using wafer bonding and deposition of dissimilar materials where optical coupling is improved by use of mode conversion and a butt-coupling scheme and where an active layer comprises two or more functional sub-layers.

Spatially distributed active functionalities are used in the present invention to manipulate optical mode characteristics (such as phase) as the optical wave passes through one or more parts of the PICs.

In the following detailed description, reference is made to the accompanying drawings which form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as top/bottom, left/right, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are connected between the elements that are said to be coupled with each other. The term "directly coupled" means that two or more elements are in direct contact in at least part of their surfaces. The term "butt-coupled" is used herein in its normal sense of meaning an "end-on" or axial coupling, where there is minimal or zero axial offset between the elements in question. The axial offset may be, for example, slightly greater than zero in cases where a thin intervening layer of some sort is formed between the elements, as described below with regard to element 106, 206, 306 etc.

Terms "active device" and/or "active layer" or "active sub-layer", may be used herein. A device or a layer or sub-layer of a device called active carries out one or more functions of light generation, amplification, modulation, detection and/or exhibits efficient non-linear behavior. We use the terms active device and active layer or sub-layer interchangeably meaning either one of them and/or both. This is in contrast to "passive device", "passive waveguide" and/or "passive layer" whose principal function is to confine and guide light, and or provide splitting, combining, filtering, isolating, circulating, out-of-plane emission, and/or other functionalities that are commonly associated with passive devices. The term "non-linear" refers to non-linear optical responses to frequency, polarization, phase or path of incident light, such as frequency-mixing processes, Kerr effect, stimulated Brillouin scattering, etc.

Although it would be generally understood by those of skill in the art of optics that that an optical "mode" pertains to the electromagnetic field pattern in space, while the word "field" pertains to the electrical field vector at a particular point, the terms field and mode may occasionally (for convenience) be used interchangeably in this disclosure.

FIG. 1 is a schematic cross-section view of an integrated photonic device 100 utilizing butt-coupling and mode conversion for efficient coupling between materials with dissimilar refractive indices. The exemplary cross-section includes a substrate 105 that can be any suitable substrate for semiconductor and dielectric processing, such as Si, InP, GaAs, quartz, silicon-on-insulator or other materials known in the art. In the shown embodiment, a layer of second material 104 is deposited, grown, transferred, bonded or otherwise attached to the top surface of substrate 105 using techniques known in the field. The main purpose of layer 104 is to provide optical cladding for material 102 (to be described below) if such cladding is necessary to form an optical waveguide. Optical waveguides are commonly realized by placing a higher refractive index core between two lower refractive index layers to confine the optical wave. In some embodiments, layer 104 is omitted and substrate 105 itself serves as a cladding.

Layer 102 is deposited, grown, transferred, bonded or otherwise attached to the top of layer 104, or to the top of substrate 105 if layer 104 is not present, using techniques known in the field. The refractive index of layer 102 is higher than the refractive index of layer 104 if present, or, if layer 104 is not present, the refractive index of layer 102 is higher than the refractive index of substrate 105. In one embodiment, the material of layer 102 may include, but is not limited to, one or more of SiN, $TiO_2$, $Ta_2O_5$, $SiO_2$, $SiO_xN_y$, $LiNbO_3$ and AlN. In some embodiments, other common dielectric materials may be used for layer 102. In other embodiments, a semiconductor material used for layer 102 may include, but not be limited to, one or more of Si, GaAs, AlGaAs, InP.

Either or both of layers 104 and 102 can be patterned, etched, redeposited, planarized or otherwise processed as is common in the art before layer 101 is bonded on top of the whole or part of the corresponding (104, 102) top surface. In some cases, where 104 is not present, substrate 105 may be patterned. In one embodiment, also as illustrated in FIG. 1, layer 101 is bonded on top of layer 102, but said layer 102 can also be removed prior to bonding or not deposited at all in the region where 101 is then bonded directly to layer 104. Furthermore, in some embodiments, said layer 101 can be bonded directly to layer 105, in which case layers 102 and/or 104 were either removed or were not deposited at all in the region where 101 is bonded directly to layer 105. Said bonding can be direct molecular bonding or can use additional materials to facilitate bonding such as e.g. metal layers, dielectrics, or polymer films as is known in the art. Layer 101 makes up what is commonly called an active layer, and may be made up of materials including, but not limited to, InP and InP-based ternary and quaternary materials, GaAs and GaAs based ternary and quaternary materials, GaN, GaP, InAs and InSb and their variations and derivatives. Layer 101 is multilayered, comprising at least two distinct sub-layers (101a and 101b in FIG. 1), each optionally comprising multiple additional sub-layers, which may provide both optical and electrical confinement as well as an interface for electrical contacts, as is known in the art for active devices. In yet another embodiment, layer 101 uses lower layers 102, 104 and/or 105 to provide electrical and/or optical confinement and/or one or more electrical contacts (not shown). The two sub-layers 101a and 101b are optimized to provide specific active functionality. In some embodiments, sub-layer 101a can be efficiently electrically pumped to generate optical emission and gain. In some embodiments, sub-layer 101b can provide efficient phase modulation, amplitude modulation, non-linear behavior and/or passive device functionalities.

The present invention enables efficient optical coupling between waveguides formed in layer 101 and layer 102. An optical mode, starting from the right side of the figure, is largely contained in layer 101, where layer material composition and waveguide geometry can control and adjust the relative degrees of confinement in sub-layer 101a vs. sub-layer 101b. In one embodiment, more than 50% of the optical mode resides in sub-layer 101a as suggested by mode profile 150. Mode profile 150 can be efficiently coupled to mode profile 151 by designing appropriate tapers or angled interfaces, as the refractive indices of sub-layers 101a and 101b are similar (refractive indices typically differ by less than 1, and in certain embodiments the difference is significantly less than 0.2).

Efficient coupling between mode profiles 151 and 154 is more challenging as sub-layer 101b and layer 102 typically have a difference in refractive index larger than 1. In certain embodiments the difference is smaller, but still larger than 0.2. In the case of using inverse tapers to form the transition, the requirements on taper tip dimensions become prohibitive limiting efficient power transfer with common tools and techniques. This is especially true if sub-layer 101b thickness is greater than 250 nm or more.

To improve the coupling efficiency between mode profiles 151 and 154, we introduce layer 103. Layer 103 serves as an intermediate waveguide that in some embodiments efficiently accepts the profile (depicted by dashed line 151) of an optical mode supported by the waveguide for which sub-layer 101b provides the core, captures it efficiently as mode profile 152, and gradually transfers it to mode profiles 153, and finally 154. Mode profile 154 is then efficiently coupled to the waveguide for which layer 102 provides the core.

In other embodiments, the direction of travel may be reversed, with layer 103 efficiently capturing an optical mode supported by the waveguide for which layer 102 provides the core and gradually transforming its mode profile from 154 to 153 and finally to mode profile 151 that is efficiently supported by the waveguide for which sub-layer 101b provides the core.

The refractive index and geometry of layer 103 can be engineered to facilitate efficient coupling of mode profile 151 and to efficiently transform the mode to one with mode profile 154 by taking advantage of tapered structures made in layer 102 and/or 103. In the absence of intermediate layer 103, described herein and in U.S. application Ser. No. 16/254,883 referenced above, the requirements on taper tip width would be, as discussed above, problematic. The use of intermediate layer 103, however, significantly reduces the stringent requirements on taper tip width, allowing efficient transfer between high refractive index materials in layer 101b to low refractive index materials in layer 102. Layer 103 may comprise a dielectric, polymer and/or any other suitable material.

In one embodiment, layer 102 is discontinuous as illustrated with FIG. 1. In another embodiment (not shown) layer 102 is continuous along the structure, extending below both layers 103 and 101b with the dimensions of layer 102 optimized to facilitate efficient transfer of an optical mode between the waveguides formed by 103 and 102.

The material chosen for layer 102 can provide additional functionality such as wide-band transparency, high intensity handling, phase shifting by temperature, strain or other tuning mechanisms, combining, splitting, filtering, emission at an angle, and/or others as is known in the art.

Differences between the optical modes supported by waveguides in sub-layers 101a/101b and layer 102 respectively may or may not be obvious by observation of the mode profiles, but mode overlaps less than 100% could (in the absence of intermediate layer 103) result in significant optical loss. In some cases, it may be considered that losses of up to 1 dB are acceptable, but losses greater than that are not. In other cases, a 3 dB or 6 dB loss level may be the criterion chosen. The function of layer 103 is to keep optical loss due to imperfect optical field overlap below whatever is determined to be an acceptable level in a given application.

The upper cladding layer 107 for waveguides realized in 103 and/or 102 can be ambient air (meaning no cladding material is actually deposited) or can be any other deliberately deposited suitable material as shown in FIG. 1, including, but not limited to, a polymer, $SiO_2$, $SiN$, $SiO_xN_y$, etc. Said upper cladding 107 can also be used as cladding material for layers 101b and 101a. In certain embodiments, the multilayered 101a and 101b comprise cladding. Said cladding 107 can be continuous between layers 102, 103 and/or 101, but can also be deposited in parts with different materials. Electrical contacts, two of which 108 and 109 are shown in this sideview but more are typically used, provide current or voltage control interfaces for active layers 101a and 101b. Contacts are designed in such way that interaction between the optical mode and metal is minimized as is known in the art. This can be done by controlling the optical confinement and/or offsetting the contacts from the center of the mode in plane perpendicular to FIG. 1.

Said transition between mode profiles 151 and 154 is facilitated by layer 103, and, in cases where layer 106 is present, by layer 106. Optional layer 106 primarily serves as either an anti-reflective or a highly-reflective coating at the interface between layer 101b and layer 103. Other interfaces can also utilize coatings to control transmission and/or reflection between different layers.

Layer 101 comprises at least two sub-layers 101a and 101b, each of which can comprise pn-junctions with or without one or more intrinsic regions, quantum-well regions, quantum-dot regions, carrier confinement regions, and/or optical confinement regions or other regions commonly used in active optical semiconductor devices. In one embodiment, sub-layer 101a comprises a typical laser epitaxial structure including a p-contact on top and an n-contact on bottom. Said n-contact is shared with sub-layer 101b and there is a second p-contact on the bottom of sub-layer 101b for controlling the functionality of sub-layer 101b. In yet another embodiment, the layer structure is inverted so instead of a p-n-p structure, an n-p-n structure is used. In yet another embodiment, each of sub-layers 101a and 101b comprises its own separate pn junction structure. In yet another embodiment, sub-layer 101b does not have a functional pn-junction, but primarily serves passive device and/or non-linear generation functionalities.

After layer 102 has been grown or deposited on substrate 105 (with or without optional intervening layer 104) and patterned if necessary, to form a "102" structure, a layer 101 (itself comprising sub-layers 101a and 101b) is bonded in a single step to the "102" structure. No precise alignment is required for this bonding step. All subsequent processing steps that do require precise alignment between layers forming cladding, core, contacts etc are carried out using lithographic marks, as discussed below.

The "101" structure is designed to facilitate transfer from a mode that dominantly resides in sub-layer 101a to one that dominantly resides in sub-layer 101b, where the materials of sub-layers 101a and 101b are chosen such that the refractive indices are very close, so selectively etching at least part of sub-layer 101a can readily create a suitable waveguide geometry—a gentle taper—that allows efficient mode transfer to be achieved. It is clear to one skilled in the art that additional sub-layers and transitions in layer 101 can be introduced without departing from the spirit of invention.

Multiple functionalities can therefore be realized with the single bonding step described above, but in addition, different active materials can be bonded in parts on places where other active functionality is needed. In some embodiments different types of active layers in the form of other "101" structures can be bonded onto the same substrate 105 and be co-processed in parallel or sequentially. One or more lithography alignment marks (not shown in this cross-sectional view, but see, for example, 220 in FIG. 2 or 420 in FIG. 4 described below) are present to facilitate precise alignment between the layers formed during subsequent processing steps.

Figure 2A:
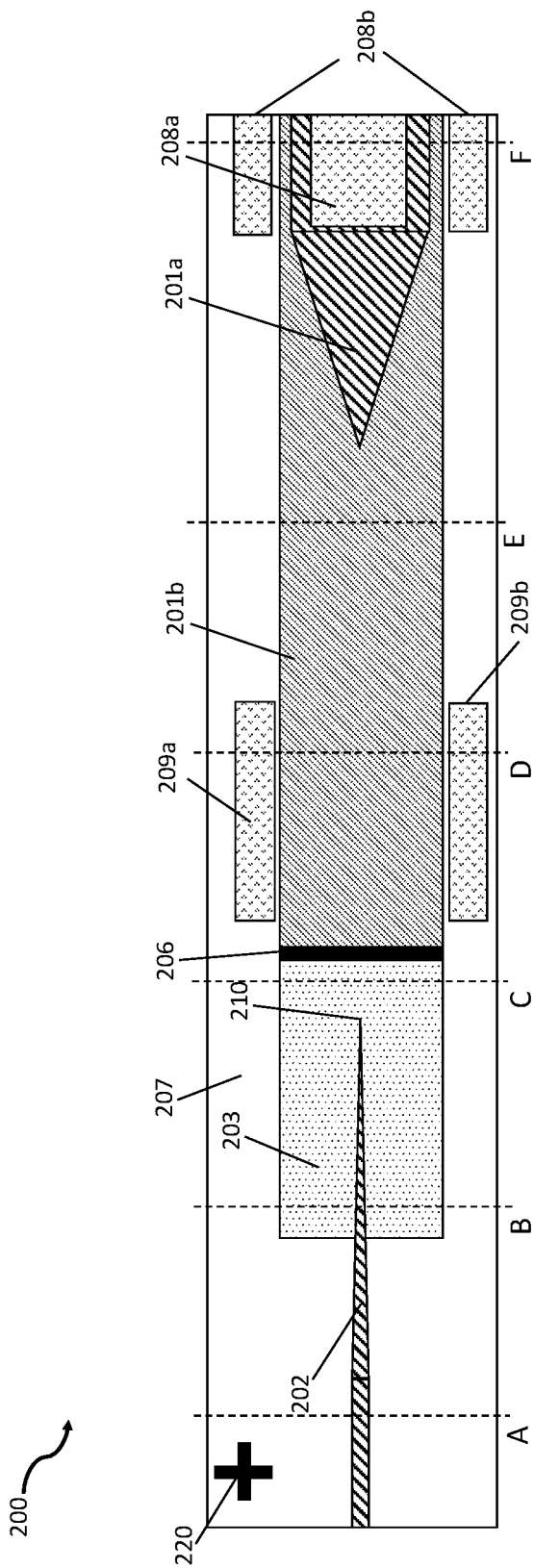
FIG. 2A shows a cross-sectional top-down view of a device according to some embodiments of the present invention.
Figure 2B:
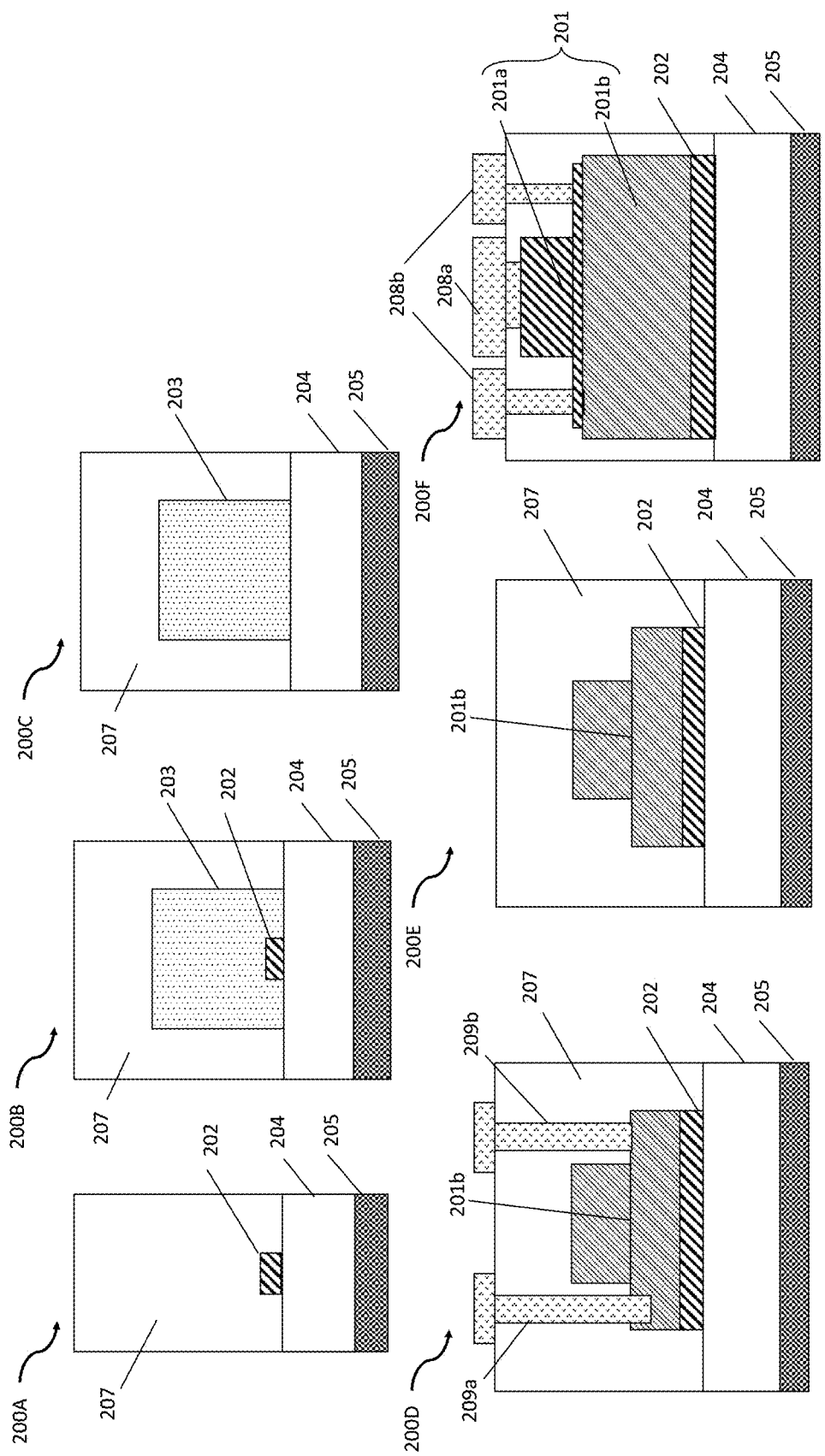
FIG. 2B shows a cross-sectional end-on view of the device of FIG. 2A.

FIG. 2A offers a top-down view of a device 200 according to some embodiments of the present invention, and FIG. 2B shows several corresponding end-on cross-sectional views 200A, 200B, 200C, 200D, 200E, and 200F of that device.

The top-down view of device 200 shows optional upper cladding layer 207 that covers optional lower cladding layer 204 and substrate 205 (neither of which is visible in this view, but they are both shown in views 200A-200F). The optical mode supported by "active" layer 201 is guided from one dominantly residing in layer 201a, through appropriate taper and/or transition structure to an optical mode dominantly residing in layer 201b. That taper structure can be an inverse taper as shown in view 200, can be just an abrupt termination, an angled surface or any other transition that provides desired ratios of transmission and reflection. Said interface can be coated (not shown) to further control the transmission and reflection ratios. A mode efficiently guided by sub-layer 201b is transformed to a mode efficiently guided by layer 202. Said transition can be optimized by adjusting the angle of the interface between 201b and 203 to control reflection and transmission, and/or by depositing an optional coating 206 as described below in relation to FIG. 5. The refractive index of the mode dominantly residing in 203 is smaller than the refractive index of the mode dominantly residing in 201b and coupling is facilitated by optimizing the waveguide cross-sections for butt-coupled transmission with no taper structures. Taper structures would be ineffective as the difference in refractive indices is large, typically larger than 1. In certain embodiments the difference is smaller, but still larger than 0.2. Instead of tapering, the height and/or width of either or both of 103 and 101b may be adjusted to maximize the coupling. In some cases, as in the embodiment shown in FIG. 1, where 103 and 101b differ in either height or width, a slight axial offset between 103 and 101b will be present, meaning the butt-coupling may be termed "partial" rather than "full".

Layer 203 primarily serves to convert the mode for efficient coupling to layer 202. To facilitate that coupling, the dimensions of layer 202 are tapered down towards layer 201a, as indicated by the relatively small width of the tip 210 relative to the width of layer 202 shown at the extreme left of the figure. It has been calculated that the requirements on taper dimensions are significantly relaxed up to several hundred nanometers due to the presence of layer 203. For example, a coupling efficiency between 201b and 202 of greater than 50% may be achieved, even if the refractive index difference between 201b and 202 is larger than one, for a tip width of a few hundred nanometers. In contrast, in the absence of layer 203, where layer 201b has to be tapered such that its mode may directly couple into layer 202, the dimensions of taper tip would have to be much less than one hundred nanometers for a similar coupling efficiency. In another embodiment, a taper is created in layer 203 instead of in layer 202. In yet another embodiment, tapers may be created in both layers 202 and 203 for highly efficient coupling.

In some embodiments (not shown), the taper tip can physically touch layer 206, or layer 201b if layer 206 is not present. In yet another embodiment (not shown), the tapering of layer 202 extends over the full length of layer 201a (to the right in the orientation shown in the figure) so that there is no abrupt termination, but the width variation continues to facilitate more efficient coupling.

Four electrical contacts 208a, 208b, 209a and 209b are shown. In one embodiment contacts 208a and 208b are used for vertically injected laser structure formed in layer 201a and contacts 209a and 209b are used for laterally and/or vertically injected active structure in layer 201b as shown in 200. In another embodiment (not shown), certain contacts are shared in case active structures are designed as p-n-p or n-p-n structures. In another embodiment additional electrical contacts (more than four) are introduced for additional flexibility in controlling the devices or if active layer 201 comprises more than two sub-layers (not shown). In yet another embodiment (not shown) electrical contacts 209a and 209b are not present as layer 201b provides passive functionality and/or non-linear functionality. Contacts are designed in such way that interaction between the optical mode and metal is minimized as is known in the art. This can be done by controlling the optical confinement and/or offsetting the contacts from the center of the mode as suggested in 200, 200D and 200F.

One or more lithography alignment marks 220 (only one shown for simplicity) are used for precise alignment between layers formed in various processing steps.

Cross-sectional views 200A, 200B, 200C, 200D, 200E and 200F correspond to six characteristic locations marked A, B, C, D, E and F in the top down view of FIG. 2A. Cross-sections 200D-200F show an exemplary cut through a region that comprises one or other of both of sub-layers 201a and 201b of layer 201. In the embodiments shown in cross-sectional views in FIG. 2B, layer 201 comprises two distinct active sub-layers 201a and 201b. In other embodiments (not shown) the number of distinct active sub-layers may be three or more. Cross sections 200D-200F show layers 202 and optional layer 204 (as described with regard to 102 and 104 in relation to FIG. 1). In embodiments where layer 202 does not terminate before layers 206 and/or the left edge of layer 201 (before returning to be present up to the right edge of layer 101), of course view 200C would not be found. Cross-section 200B shows a region where the tapered transition between layers 203 and 202 is formed. In some embodiments (not shown), layer 203 is tapered. In yet another embodiment (not shown), both layers 202 and 203 are tapered. As discussed above, the requirements on taper tip dimensions are significantly reduced due to the mode conversion carried out by layer 203. Cross-section 200A shows one embodiment of layer 202 at the far left of the device as shown in view 200, after optical coupling (assuming optical signal flow occurs from right to left in FIG. 2A) is complete. Typical heights and widths of waveguides 201, 202, and 203 can range from submicron to several microns, although they are largely dependent on specific material systems and implementations. In some embodiments, the thickness of layer 201b is greater than 250 nm. Optional upper cladding layer 207 is shown in all views 200A-200F.

Electrical contacts can be implemented in many ways. In one embodiment, and as illustrated in FIG. 2B, the electrical contacts for sub-layer 201a are implemented as for vertically injected structures where the overlap of contacts 208a with the optical mode is controlled by layer composition of layer 201a while the overlap of contacts 208b with the optical mode is controlled by lateral offset. Said overlap between optical mode and metal is preferably minimized as it directly causes loss. Both contacts for sub-layer 201b are laterally offset. In some embodiments, sub-layer 201a is fully etched and contacts 208b are realized partly through sub-layer 201b (not shown).

In another embodiment (not shown), all the contacts are laterally offset. In yet another embodiment (not shown) some electrical contacts are realized through substrate 205. Many other combinations for realizing electrical contacts to active layers or sub-layers are possible as is obvious to one skilled in the art of designing active optical devices.

Figure 3:
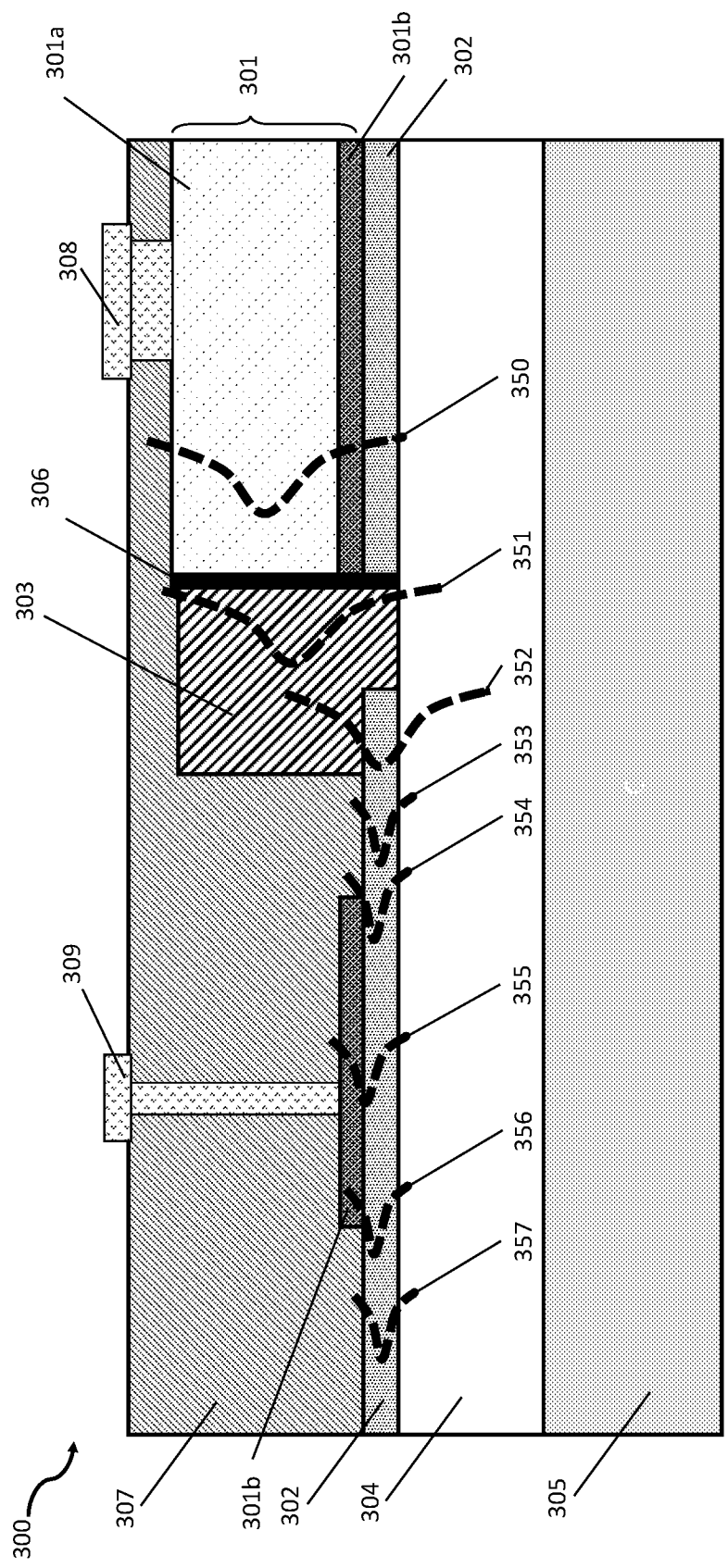
FIG. 3 illustrates a device according to another embodiment of the present invention, shown in cross-section.

FIG. 3 is a schematic cross-section view of an integrated photonic device 300 utilizing first, as the optical wave progresses from right to left in the figure, butt-coupling and second, mode conversion for efficient coupling between materials with dissimilar refractive indices. The components of device 300 (layer 301 with sub-layers 301a and 301b, and layers 302 through 309) correspond directly to components of device 100 (layer 101 with sub-layers 101a and 101b, and layers 102 through 109). Descriptions of material choices, functionality, and fabrication described above with regard to device 100 essentially apply to the corresponding components of device 300, and will not be repeated here.

The key distinction between the embodiment shown in FIG. 3 (and that in FIG. 4 to be described later) and those shown in FIGS. 1 and 2 is the thickness of sub-layer 301b (or 401b) vs that of 10 1b. In the FIG. 3 and FIG. 4 cases, the thickness is kept sufficiently small that a portion of the active sub-layer 301b (or 401b) lying above the portion of the passive layer 302 (or 402) on the left hand side of the figure provides additional functionality, allowing efficient transformation between modes in this part of the device, using, for example, tapers, abrupt terminations and/or angled interfaces without the need for butt coupling. In cases where taper structures are used to facilitate the transformation, the dimensions of the taper tips can generally be large, simplifying manufacturing. Mode transformation is facilitated by the reduced thickness, as confinement and modal refractive index in the active sub-layer 301b (or 401b) are correspondingly reduced and a closer match to the modal refractive index of the passive layer 302 (or 402).

As FIG. 3 shows, mode profile 353 entering that portion of the passive layer from the intermediate layer 303 can therefore evanescently couple across the 302/301b interface while traveling along layer 302 from right to left, before exiting with mode profile 357. The desired active functionality is achieved using electrical contact 309, manipulating optical mode 355 to adjust its phase, amplitude or other characteristics. In the FIG. 1 case, in contrast, those sorts of adjustments would have to be made using electrical contact 109 on the right-hand side of the device, before the optical mode is butt-coupled into intermediate layer 103, and no further active manipulation is possible.

In some embodiments, the thickness of layer 301b is less than 500 nm, or preferably less than 250 nm. In some cases, the thickness is less than 100 nm. In some embodiments, the thickness of layer 301b is significantly less than thickness of layer 301a. As noted above, having such low thicknesses simplifies the conversion of modes between modes dominantly residing in passive layer 302 and modes dominantly residing in overlying active sub-layer 301b, isolated from layer 301a.

In some cases, the functionality of layer 301b on the right hand side of device 300 can be utilized using a contact (not shown) on that side of device 300. In other cases, the functionality is only used for layer 301b on the left hand side of device 300, after the optical mode is efficiently transferred to layer 302 using layer 303 as described above and shown in FIGS. 3 and 4. In yet other cases, the functionality may be utilized in both locations.

Figure 4A:
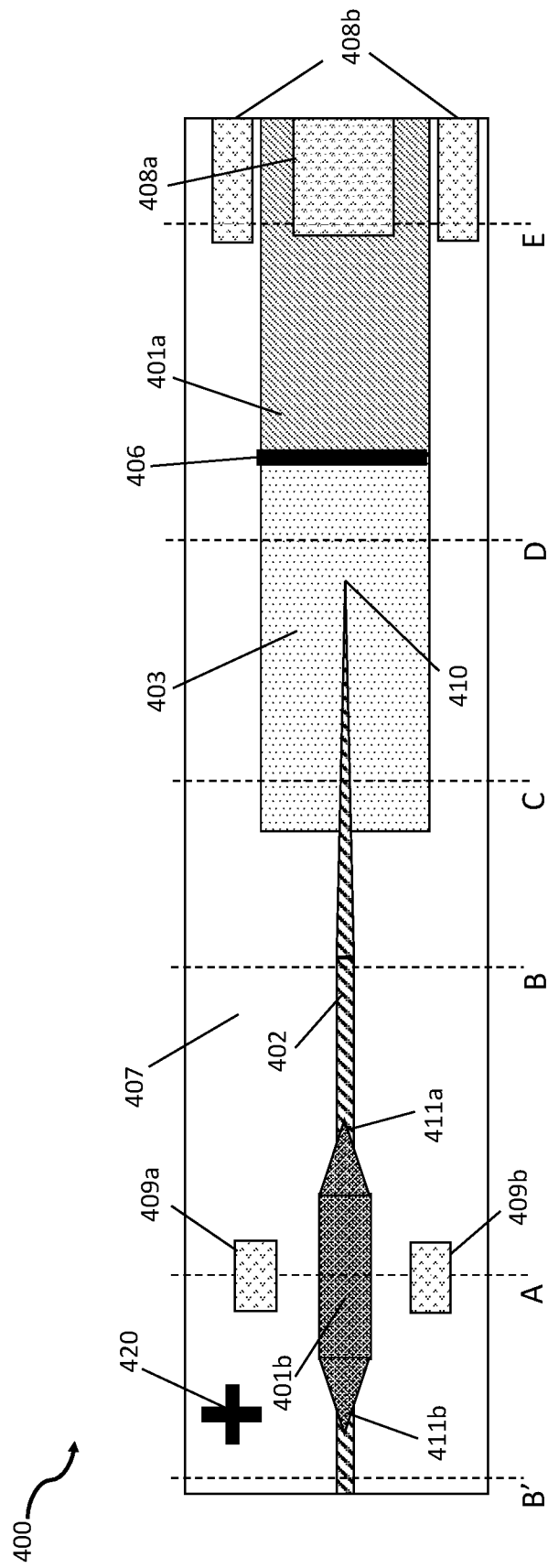
FIG. 4A shows a cross-sectional top-down view of a device according to some embodiments of the present invention.
Figure 4B:
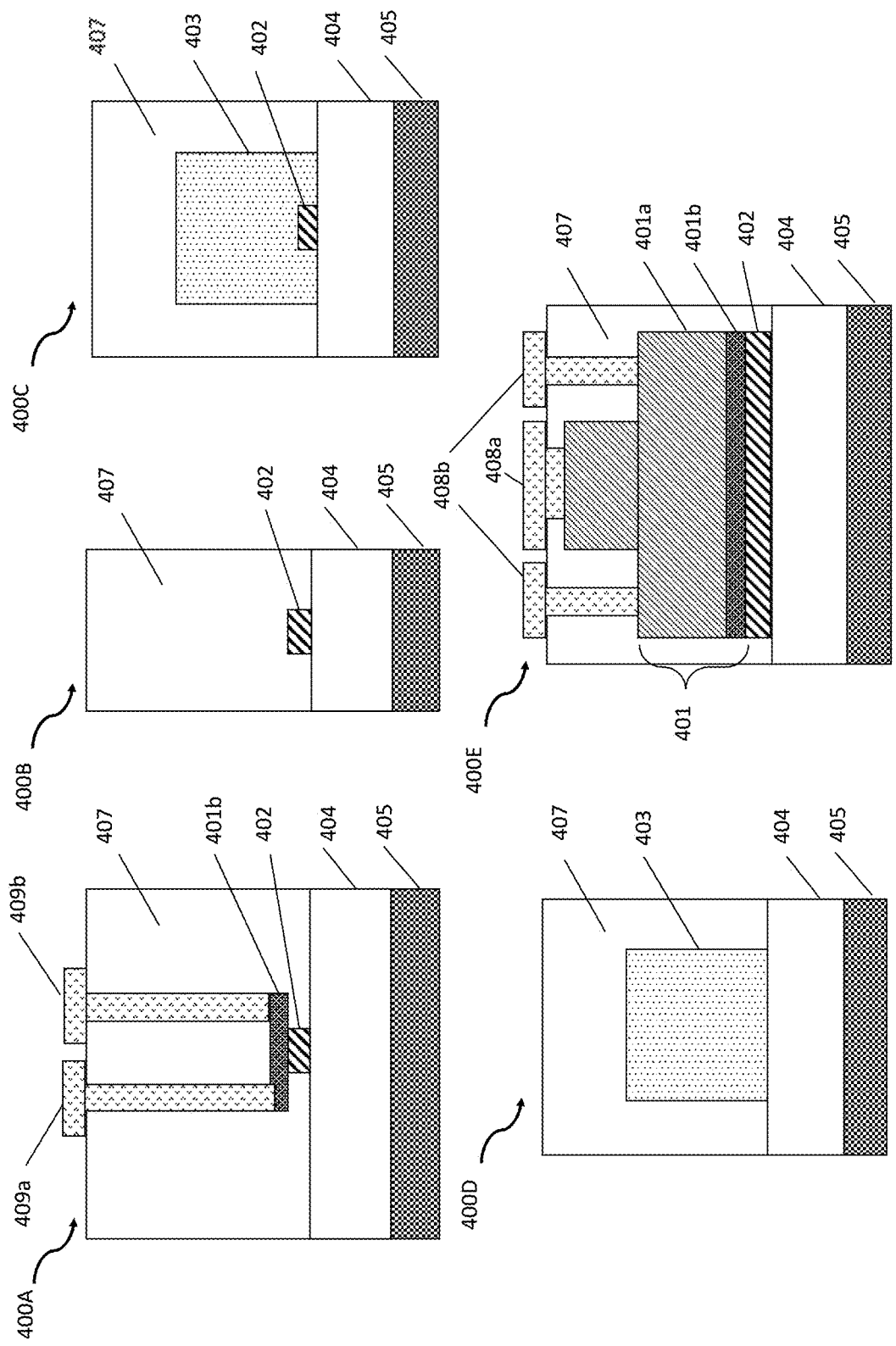
FIG. 4B shows a cross-sectional end-on view of the device of FIG. 4A.

FIG. 4A offers a top-down view of a device 400 according to some embodiments of the present invention, and FIG. 4B shows several corresponding end-on cross-sectional views 400A, 400B, 400C, 400D, and 400E of that device. A cut marked with B' would yield an end-on cross-sectional view identical to that provided by cut B, shown in view 400B.

Many components of device 400 (active layer 401 with sub-layers 401a and 401b, layers 402 through 407, electrodes 408a, 408b, 409a, and 409b, taper tip 410 and alignment mark 420) correspond directly to components of device 200 with corresponding numerals; the only additional elements shown being taper structures 411a and 411b. Much of the description of structure and functionality presented above with regard to device 200 essentially apply to the corresponding components of device 400, and will not be repeated here.

However, in device 400, the transitions of the optical mode from region marked with B to A and then to B' (or vice-versa for optical wave travel from left to right) are facilitated by taper structures 411a and/or 411b in active sub-layer 401b. These taper structures can be inverse tapers, angled interfaces, 3D-structures or any other structures that facilitate efficient transmission, which is made possible by the thinness of layer 401b. Layer 402 can also be tapered (not shown) to facilitate more efficient transition and/or control confinement. The thickness of layer 401b is less than 500 nm, or preferably less than 250 nm or even less than 100 nm, keeping effective refractive index low, and so allowing good evanescent coupling to and from underlying passive layer 402. Taper structures 411a and 411b can be coated (not shown).

Cross-sectional views 400A, 400B, 400C, 400D, and 400E correspond to five characteristic locations marked A, B, C, D, and E in top down view 400. Cross-sectional view 400B also corresponds to characteristic location marked B'.

Cross-section 400A shows an exemplary cut through a region that comprises only part of layer 401 which typically includes multilayered active structures. In one of the embodiments as sketched in cross-sections in FIG. 4B, cross-section 400A comprises only active sub-layer 401b.

Cross sections 450A-450E show optional layers 402 and/or 404 (as described with regard to 302 and 304 in relation to FIG. 3). In embodiments where layer 402 does not terminate before layers 406 and/or 401a, of course view 400D would not be found. Cross-section 400C shows a region where the tapered transition between layers 403 and 402 is formed. In some embodiments (not shown), layer 403 is tapered. In yet another embodiment (not shown), both layers 402 and 403 are tapered. As discussed above, the requirements on taper tip dimensions are significantly reduced due to mode conversion carried out by layer 403.

Cross-section 450B shows one embodiment of layer 402 at the far left of the device (B') or between two active devices (B) as shown in view 400, after optical coupling from 401 is complete. Typical heights and widths of waveguides 401, 402, and 403 can range from submicron to several microns, although they are largely dependent on specific material systems and implementations. Optional upper cladding layer 407 is shown in all views 400A-400E.

Figure 5:
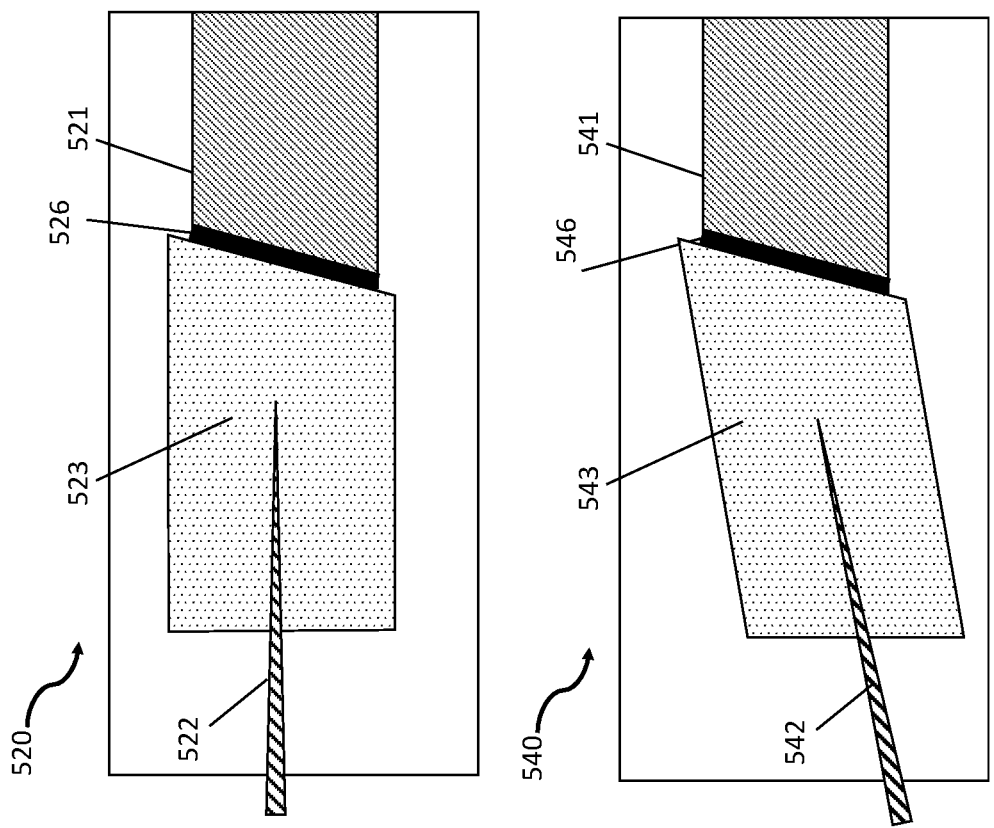
FIG. 5 illustrates a device according to yet another embodiment of the present invention, shown in cross-section.
Figure 5:
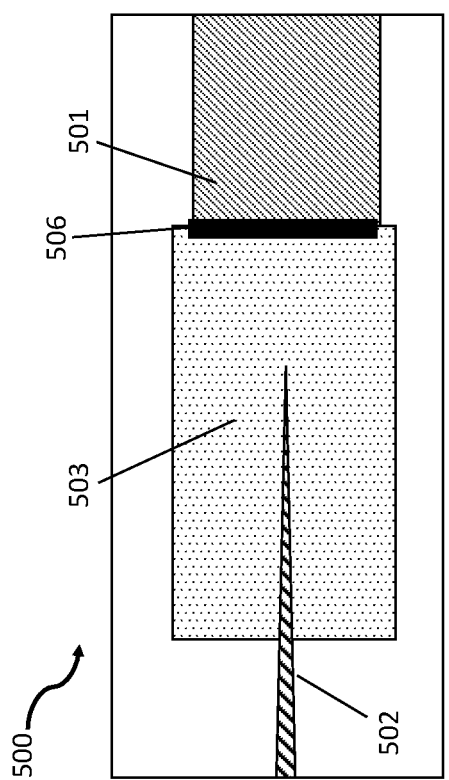

FIG. 5 shows top-down views of devices 500, 520 and 540 according to embodiments of the present invention that use different methods to achieve good optical coupling between high-refractive index layers on the right and low refractive index layers on the left. Device 500 has a "non-angled" interface between layers 501 and 503, meaning that the interface is substantially perpendicular to the optical axes on either side. As previously described in relation to devices 100, 200, 300 and 400, an optional coating layer (506 in the case shown) may be present to optimize reflection and/or transmission. Tapers may also be present in one or both of layers 502 and 503 to facilitate more efficient transmission between the layers (a taper in 502 is shown as an example).

The top-down views of devices 520 and 540 show a different approach, where there is an intentionally non-perpendicular interface between butt-coupled layers (layers 521 and 523 in device 520 and layers 541 and 543 in device 540), meaning in turn that that interface is not perpendicular to the optical axes of waveguides formed in those layers. Deliberately providing such an angle can serve to reduce reflection or otherwise improve the performance of the transition. In the figure, the angle is shown as being in a lateral plane, the plane of the figure, but in some embodiments (not shown) the angle may be in a vertical plane or have components in both lateral and vertical planes. Device 520 shows a case where the optical axis of layer 523 is aligned with that of layer 521, but generally better coupling efficiency is provided by an arrangement such as that of device 540, where the optical axis themselves meet at a non-zero angle, with that angle being optimized depending on the angle between the interface and the optical axis of 541 and depending on the difference in refractive indices between 541 and 543. Simulations of possible angular arrangements, to optimize transition, are straightforward to perform with the use of commercial electromagnetic solvers. Optional coating layer 526 (or 546) can further optimize reflection and/or transmission as described earlier in relation to 506, and a taper in 522, 523 (or 542, 543) and/or both may also serve to facilitate more efficient transmission between the layers.

In some embodiments (not shown), one of more wave-guiding layers can be curved. The curved portions would be formed predominantly in 523, 522 and/or both as is known in the art of designing photonic integrated circuit waveguides in case of device 520. Devices 500 and 540 can also have curved portions in their corresponding regions.

Figure 6:
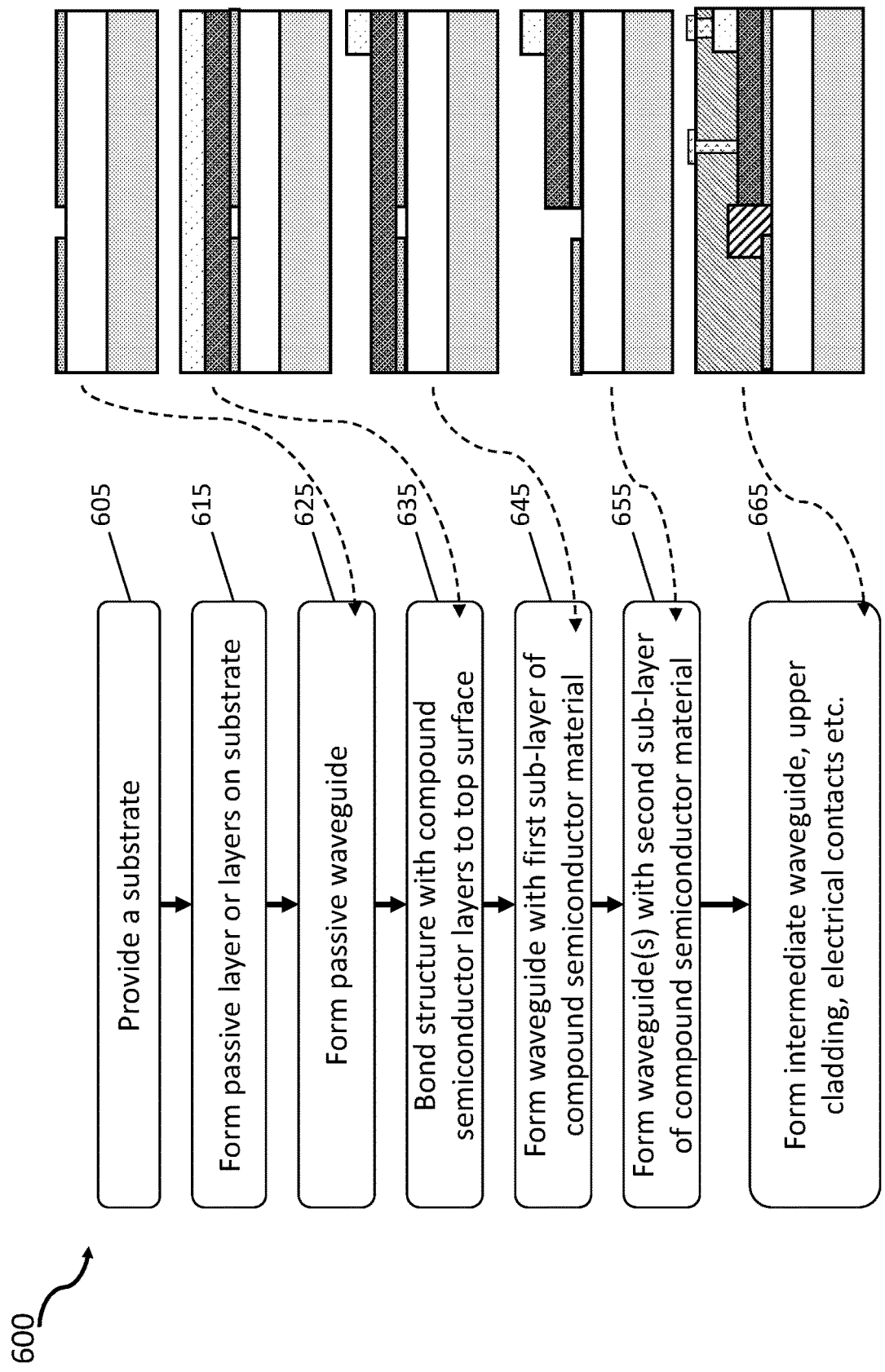
FIG. 6 is a process flow diagram of a method according to some embodiments of the present invention.

FIG. 6 is a process flow diagram of a method according to some embodiments of the present invention, showing some of the operations carried out to make integrated devices of the types described above in relation to FIGS. 1, 2a and 2b. The drawings on the right show exemplary cross-sections after certain operations carried out to make integrated devices are performed.

Method 600 for making the devices need not always include all the functions, operations, or actions shown, and need not include them in exactly the sequence illustrated by the sequence from blocks 605 through 665 as shown. Additional functions, operations, or actions can be included without departing from the spirit of invention. In an exemplary case, however, method 600 begins with block 605, in which a substrate such as substrate 105 in the FIG. 1 embodiment, suitably prepared for subsequent processing steps, is provided. Method 600 may then proceed from block 605 to block 615, where a first element, comprising one or more dielectric or other materials, is formed on the prepared substrate, by deposition, growth, transfer, bonding, etching or some other well-known technique to serve as lower cladding. This step is optional as explained above in relation to devices 100 and 200. Next, materials suitable for the formation of a passive waveguide (e.g. 102, 202) are formed by deposition, growth, transfer, planarization, bonding, etching or some other well-known technique.

From block 615, method 600 may proceed to block 625 where a waveguide, and optionally other structures, such as, but not limited to, couplers, filters, resonators, gratings, etc. are defined, the waveguide comprising a core layer (102 in the case of FIG. 1) and optionally a lower cladding layer (104 in the case of FIG. 1). Subsequent steps (not shown) might include additional material deposition or removal in preparation for step 635. At this stage, the structure formed may be termed a passive element.

From block 625, method 600 may proceed to block 635 in which another structure, that may be termed an active element, typically involving an active semiconductor material, is bonded on the top surface of the passive element (layer 102, 104 and/or 105, as described with regard to FIG. 1). This bonding can be direct molecular bonding or can use additional materials to facilitate bonding such as e.g. metal layers or polymer films as is known in the art. In general, there is no need for precise alignment, as subsequent processing of the active element is performed using common alignment marks defined on the common substrate (e.g. 105) or other layers already present on that common substrate. Subsequently, alignment marks might be transferred to the active element during processing.

From block 635, method 600 may proceed to block 645, where a waveguide (101a in FIG. 1) and optionally other structures, such as, but not limited to, couplers, filters, resonators, detectors, amplifiers, optical sources or other are defined in a sub-layer (101a in FIG. 1) of an active layer (101 in FIG. 1) in the active element.

Next, at step 655, another waveguide (101b in FIG. 1) and optionally other structures, such as, but not limited to, couplers, filters, resonators, detectors, amplifiers, modulators, optical sources or other are defined in a sub-layer (101b in FIG. 1) of the active layer (101 in FIG. 1) in the active element.

Steps (not shown) subsequent to steps 645 and/or 655 might include additional material deposition or removal in preparation for step 665, in which a third element, comprising one or more dielectric materials, polymers or other suitable materials is formed (by deposition, growth, transfer, bonding or some other well-known technique) in a location between and in at least partial butt-coupled and/or evanescent contact with the passive and active elements.

Next, at step 665, an intermediate waveguide is defined in the third element, an optional upper cladding (107) may be deposited, and electrical contacts may be formed in the active element. Further processing of the various dielectric and/or semiconductor layers, and/or electrical contacts, and the addition and processing of index matching layers, additional upper cladding, bonding pads, etc may be performed as is known in the art.

A similar process flow diagram may readily be envisaged for a method according to embodiments of the present invention, showing some of the operations carried out to make integrated devices of the types described above in relation to FIGS. 3 and 4. It would include substantially similar steps as method 600, but mask sets and processing steps would be optimized to account for different material thicknesses, transition structures and placement/patterning of active and passive layers.

It is to be understood that in the various embodiments of devices described herein, optical coupling between modes in active and passive layers is reciprocal, so that, taking FIG. 1 as exemplary, the structure can be configured to facilitate light transmission from layer 101 to layer 102 as explicitly shown, but also to facilitate transmission in the reverse direction, from layer 102 to layer 101. In is to be understood that multiple such transitions with no limitation in their number or orientation can be realized on a suitably configured PIC.

Full functionality of the active platform is enabled with no need for regrowth that is typically performed at elevated temperatures leading to material degradation if coefficients of thermal expansion between used materials are too large which is commonly the case. In some embodiments optimized regrowth is used that does not result with device performance degradation.

Embodiments of the present invention offer many benefits. The integration platform enables scalable manufacturing of PICs made from multiple materials and capable of covering a wide wavelength range from visible to IR and handling high optical power compared to typical Si waveguide-based or InP waveguide-based PICs.

Previous approaches have generally used taper structures in order to transfer an optical mode from an active device to a passive device, where a width of compound semiconductor layer is adiabatically tapered down to sub-micron size. However, a required width of the taper tip decreases rapidly to tens of nanometer sizes as the difference in refractive indices increases. The present invention deploys a butt coupling scheme to eliminate the need of a very small taper size in the compound semiconductor waveguide, which eases fabrication of such structures.

Other approaches have relied on die attachment of prefabricated optical active devices to passive waveguides. This requires very stringent alignment accuracy which is typically beyond what a typical die-bonder can provide. This aspect limits the throughput of this process as well as the performance of optical coupling.

This present invention utilizes a process flow consisting of typically wafer-bonding of a blanket piece of compound semiconductor material on a carrier wafer with dielectric or other types of waveguides and subsequent semiconductor fabrication processes as is known in the art. The use of a single common substrate, meaning that first, passive layers (in which passive waveguides may be defined) are formed on that substrate, and second, a structure containing active materials (in which active waveguides may be defined post bonding) is attached to the top surface before further processing continues, is a key feature of the present invention. The invention is also notable for enabling an accurate definition of optical alignment between active and passive waveguides via typically photo lithography step using common alignment marks, removing the need for precise physical alignment during bonding. Said photo lithography-based alignment allows for scalable manufacturing using wafer scale techniques.

Efficient optical transfer between dissimilar materials is facilitated by using a butt-coupling approach in combination with a mode-converter (the intermediate waveguide) that removes the need for narrow taper tips that are challenging to resolve and fabricate with current state-of-the-art tools.

Some embodiments of the present invention are notable for their use of at least two sub-layers of active material, where the thickness of one of the sublayers is selected to be sufficiently low to allow for good evanescent coupling between a portion of a corresponding active waveguide and an adjacent passive waveguide, offering additional, convenient options for mode conversion.

In some embodiments the active layers or sub-layers can utilize the substrate for more efficient thermal sinking, due to direct contact to the substrate with no dielectric in-between. In such embodiments, the active layers or sub-layers fully define the active optical waveguides and transitions to the passive waveguides via the above mentioned butt-coupling.

In some embodiments, the active layers or sub-layers create a hybrid waveguide structure with dielectric layers which can be used, for example, to create a wavelength selective component formed inside the laser cavity for e.g. distributed feedback (DFB) lasers or similar components.

Embodiments of the optical devices described herein may be incorporated into various other devices and systems including, but not limited to, various computing and/or consumer electronic devices/appliances, communication systems, sensors and sensing systems.

It is to be understood that the disclosure teaches just a few examples of the illustrative embodiment and that many variations of the invention can easily be devised by those skilled in the art after reading this disclosure.

The invention claimed is:

1. A device providing efficient transformation between an initial optical mode and a second optical mode, the device comprising:
   first, second and third elements fabricated on a common substrate;
   wherein the first element comprises first and second active sub-layers supporting initial and final optical modes respectively with efficient mode transformation between said initial and final optical modes, the second element comprises a passive waveguide structure supporting a second optical mode, and the third element, at least partly butt-coupled to the first element to allow efficient capture of the final mode, comprises an intermediate waveguide structure supporting an intermediate optical mode;
   wherein, if the final optical mode supported by the first element differs from the second optical mode by more than a predetermined amount, a tapered waveguide structure in at least one of the second and third elements facilitates efficient transformation between the intermediate optical mode and the second optical mode; and
   wherein precise alignment of one or more sub-elements formed in one of the first, second and third elements, relative to one or more sub-elements formed in another one of the first, second and third elements, is defined using lithographic alignment marks.

2. The device of claim 1,
   wherein the first element comprises more than two active sub-layers.

3. The device of claim 1,
   wherein the first element is characterized by a first optical axis; and
   wherein a surface of the first element directly facing a surface of the third element is not perpendicular to the first optical axis.

4. The device of claim 3,
   wherein the third element is characterized by a third optical axis parallel to the first optical axis.

5. The device of claim 1, further comprising first and second electrical contacts, connected to first and second active sub-layers respectively.

6. A device providing efficient transformation between a first optical mode and a second optical mode, the device comprising:
- first, second and third elements fabricated on a common substrate;
- wherein the first element comprises first and second active sub-layers collectively supporting the first optical mode, the second element comprises a passive waveguide structure supporting a second optical mode, and the third element, at least partly butt-coupled to the first element to allow efficient capture of the first optical mode, comprises an intermediate waveguide structure supporting an intermediate optical mode;
- wherein, if the first optical mode differs from the second optical mode by more than a predetermined amount, a tapered waveguide structure in at least one of the second and third elements facilitates efficient transformation between the intermediate optical mode and the second optical mode;
- wherein at least one of the first and second active sub-layers is thinner than 250 nm: and
- wherein precise alignment of one or more sub-elements formed in one of the first, second and third elements, relative to one or more sub-elements formed in another one of the first, second and third elements, is defined using lithographic alignment marks.

7. The device of claim 6,
- wherein the second active sub-layer is thinner than 250 nm; and
- wherein a portion of the second active sub-layer overlies a portion of the passive waveguide structure such that evanescent coupling occurs between the portion of the second active sub-layer and the portion of the passive waveguide structure.

8. The device of claim 7,
- wherein the portion of the second active sub-layer overlying the portion of the passive waveguide structure is connected to an electrical contact, operable to adjust a characteristic of light evanescently coupled into the portion of the second active sub-layer overlying the portion of the passive waveguide.

9. The device of claim 8, wherein the characteristic is at least one of phase and amplitude.

* * * * *